US012770821B2

(12) United States Patent
Sengoku et al.

(10) Patent No.: US 12,770,821 B2
(45) Date of Patent: Oct. 20, 2026

(54) CHARGED PARTICLE BEAM WRITING APPARATUS AND CHARGED PARTICLE BEAM WRITING METHOD

(71) Applicants: NuFlare Technology, Inc., Yokohama (JP); NuFlare Technology America, Inc., Sunnyvale, CA (US)

(72) Inventors: Yasuo Sengoku, Yokohama (JP); Yoshikuni Goshima, Yokohama (JP); John William Kay, Lagrangeville, NY (US); Chising Lai, Hopewell Junction, NY (US)

(73) Assignees: NuFlare Technology, Inc., Yokohama (JP); NuFlare Technology America, Inc., Sunnyvale, CA (US)

( * ) Notice: Subject to any disclaimer, the term of this patent is extended or adjusted under 35 U.S.C. 154(b) by 579 days.

(21) Appl. No.: 18/259,674

(22) PCT Filed: Dec. 9, 2021

(86) PCT No.: PCT/JP2021/045412
§ 371 (c)(1),
(2) Date: Jun. 28, 2023

(87) PCT Pub. No.: WO2022/145194
PCT Pub. Date: Jul. 7, 2022

(65) Prior Publication Data

US 2024/0055218 A1 Feb. 15, 2024

Related U.S. Application Data

(60) Provisional application No. 63/132,054, filed on Dec. 30, 2020.

(51) Int. Cl.
*H01J 37/147* (2006.01)
*H01J 37/04* (2006.01)
(Continued)

(52) U.S. Cl.
CPC .......... *H01J 37/147* (2013.01); *H01J 37/045* (2013.01); *H01J 37/3007* (2013.01); *H01J 37/3174* (2013.01)

(58) Field of Classification Search
CPC .......... H01J 2237/1504; H01J 37/3174; H01J 37/045; H01J 2237/043;
(Continued)

(56) References Cited

U.S. PATENT DOCUMENTS 5,546,319 A * 8/1996 Satoh .................... B82Y 40/00 250/396 R
7,463,173 B2 12/2008 Sanmiya et al.
(Continued)

FOREIGN PATENT DOCUMENTS

JP 2007-271919 A 10/2007
JP 2011-22581 A 2/2011
(Continued)

OTHER PUBLICATIONS

Hasegawa et al., JP2016046432, machine translation (Year: 2016).*
(Continued)

*Primary Examiner* — Michael J Logie
(74) *Attorney, Agent, or Firm* — Oblon, McClelland, Maier & Neustadt, L.L.P.

(57) ABSTRACT

A charged particle beam writing apparatus according to one aspect of the present invention includes an electrode configured to deflect a charged particle beam, an amplifier configured to apply a deflection potential to the electrode, a diagnostic circuit configured to diagnose the amplifier, a switching circuit arranged between an amplifier output and the electrode, and configured to switch the amplifier output between the electrode and the diagnostic circuit, an electron optical system, a column configured to include the electrode and the electron optical system, a first coaxial cable config-
(Continued)

ured to connect an output side of the amplifier with the switching circuit, a second coaxial cable configured to connect the electrode with the switching circuit, a third coaxial cable configured to connect the amplifier output side with the diagnostic circuit, and a resistance configured to connect, parallelly to the switching circuit, inner conductors of the first and second coaxial cables.

10 Claims, 7 Drawing Sheets

(51) Int. Cl.
*H01J 37/30* (2006.01)
*H01J 37/317* (2006.01)

(58) Field of Classification Search
CPC ........... H01J 2237/31776; H01J 37/147; H01J 37/153; H01J 37/24; H01J 37/3007
See application file for complete search history.

(56) References Cited

U.S. PATENT DOCUMENTS

| | | | | |
|---|---|---|---|---|
| 7,898,447 | B2 | 3/2011 | Goshima et al. | |
| 2010/0030522 | A1 * | 2/2010 | Tsuchiya ................. | H01J 37/24 702/183 |
| 2010/0237261 | A1 * | 9/2010 | Nishiyama ............ | H01J 37/045 250/492.3 |

FOREIGN PATENT DOCUMENTS

| | | | | |
|---|---|---|---|---|
| JP | 2012-44051 | A | | 3/2012 |
| JP | 2012-238761 | A | | 12/2012 |
| JP | 2013-51229 | A | | 3/2013 |
| JP | 2013-51230 | A | | 3/2013 |
| JP | 2016046432 | A | * | 4/2016 |

OTHER PUBLICATIONS

International Search Report issued Feb. 1, 2022 in PCT/JP2021/045412, filed on Dec. 9, 2021, citing documents 15, 17 & 19 therein, 2 pages.

* cited by examiner

CHARGED PARTICLE BEAM WRITING APPARATUS AND CHARGED PARTICLE BEAM WRITING METHOD

This application is based upon and claims the benefit of priority from U.S. Patent Application No. 63/132,054 filed on Dec. 30, 2020 in the United States of America, the entire contents of which are incorporated herein by reference.

TECHNICAL FIELD

The present invention relates to a charged particle beam writing apparatus and a charged particle beam writing method. For example, it relates to a writing apparatus using an amplifier for deflecting electron beams with which a target object is written.

BACKGROUND ART

In recent years, with high integration of LSI, the line width of circuits of semiconductor devices is decreasing year by year. The electron beam (EB) writing technique which has excellent resolution is used as a method of forming an exposure mask (also referred to as a reticle) used for forming a circuit pattern on such semiconductor devices.

FIG. 6 is a conceptual diagram for explaining operations of a variable-shaped type electron beam writing apparatus. The variable-shaped type electron beam writing apparatus operates as described below. A first shaping aperture plate 410 has a rectangular aperture 411 for shaping an electron beam 330. A second shaping aperture plate 420 has a variable shaped aperture 421 for shaping the electron beam 330 having passed through the aperture 411 of the first shaping aperture plate 410 into a desired rectangular shape. The electron beam 330 emitted from a charged particle source 430 and having passed through the aperture 411 of the first shaping aperture plate 410 is deflected by a deflector so as to pass through a part of the variable shaped aperture 421 of the second shaping aperture plate 420, and thereby to irradiate a target object 340 placed on a stage which continuously or intermittently moves in one predetermined direction (e.g., x direction). That is, a rectangular shape that can pass through both the aperture 411 of the first shaping aperture plate 410 and the variable shaped aperture 421 of the second shaping aperture plate 420 is written in a writing region of the target object 340 on the stage continuously or intermittently moving in the x direction. This method of forming a given shape by letting beams pass through both the aperture 411 of the first shaping aperture plate 410 and the variable shaped aperture 421 of the second shaping aperture plate 420 is referred to as a variable shaped beam (VSB) method.

As described above, the writing apparatus performs writing by deflecting charged particle beams such as electron beams. A DAC amplifier unit (also just called a DAC amplifier) is used for such beam deflection. Beam deflection using the DAC amplifier unit serves, for example, for controlling the shape and size of a beam shot, controlling the position of a shot, and blanking a beam.

In order to perform the beam deflection with high precision, it is necessary to verify whether output of each DAC amplifier is conducted highly accurately. Therefore, the output performance of each DAC amplifier is verified before being mounted in the writing apparatus. However, even if each DAC amplifier has passed a performance test in a single test environment before mounted in the writing apparatus, there is a case where it cannot achieve an expected performance due to the influence of a disturbance, bad connection, and the like when it is mounted in the writing apparatus. For this reason, it is desirable to conduct a verification of a DAC amplifier in the state of having been mounted in the writing apparatus. For example, there is disclosed a method, when applying opposite phase voltages of positive-negative reversed to two electrodes being a pair, in which an abnormality detection apparatus mounted in a writing apparatus detects an abnormality of at least one of two DAC amplifiers by using an additional value obtained by adding, after passing through a capacitor individually, outputs of the two DAC amplifiers which output voltages to respective electrodes (e.g., refer to JP2010-074055A).

It seems that the output performance of the DAC amplifier is detected with sufficient accuracy because the diagnostic device such as the abnormality detection apparatus described above is mounted in the writing apparatus. However, connecting the diagnostic device to circuits of the writing apparatus has a possibility of giving an adverse effect since the diagnostic device itself may act as a disturbance source on the DAC amplifier or output signals of the DAC amplifier. For example, the cable connected in order to diagnose outputs of the DAC amplifier may act as a disturbance antenna.

SUMMARY OF INVENTION

Technical Problem

One aspect of the present invention provides a writing apparatus and method that can eliminate or reduce the influence of disturbances while a diagnostic mechanism is mounted in a writing apparatus.

Solution to Problem

According to one aspect of the present invention, a charged particle beam writing apparatus includes an electrode configured to deflect a charged particle beam;

an amplifier configured to apply a deflection potential to the electrode;

a diagnostic circuit configured to diagnose the amplifier;

a switching circuit arranged between an output of the amplifier and the electrode, and configured to switch the output of the amplifier between the electrode and the diagnostic circuit;

an electron optical system configured to irradiate a target object with the charged particle beam deflected by being applied with the deflection potential by the amplifier;

a column configured to include therein the electrode and the electron optical system;

a first coaxial cable configured to connect an output side of the amplifier with the switching circuit;

a second coaxial cable configured to connect the electrode with the switching circuit;

a third coaxial cable configured to connect the output side of the amplifier with the diagnostic circuit; and a resistance configured to connect, parallelly to the switching circuit, an inner conductor of the first coaxial cable with an inner conductor of the second coaxial cable, wherein the inner conductor of the first coaxial cable is connected to one end side of the inner conductor of the second coaxial cable through the switching circuit, and an outer conductor of the first coaxial cable is connected to one end side of an outer conductor of the second coaxial cable through the switching circuit, the inner conductor of the first coaxial cable is connected to one end side of an inner conductor of the third coaxial cable through the switching circuit, and the outer conductor of the first coaxial cable is connected to one end side of an outer conductor of the third coaxial cable through the switching circuit, and in a case of switching the output of the amplifier to a side of the electrode, the switching circuit detaches both the inner conductor and the outer conductor of the third coaxial cable from the first coaxial cable.

According to another aspect of the present invention, a charged particle beam writing method includes irradiating a target object with a charged particle beam which is deflected by being applied with a deflection potential by an amplifier, using a charged particle beam writing apparatus that includes an electrode configured to deflect the charged particle beam, the amplifier configured to apply the deflection potential to the electrode, a diagnostic circuit configured to diagnose the amplifier, a switching circuit arranged between an output of the amplifier and the electrode and configured to switch the output of the amplifier between the electrode and the diagnostic circuit, an electron optical system configured to irradiate the target object with the charged particle beam deflected by being applied with the deflection potential by the amplifier, a column configured to include therein the electrode and the electron optical system, a first coaxial cable configured to connect an output side of the amplifier with the switching circuit, a second coaxial cable configured to connect the electrode with the switching circuit, a third coaxial cable configured to connect the output side of the amplifier with the diagnostic circuit, and a resistance configured to connect, parallelly to the switching circuit, an inner conductor of the first coaxial cable with an inner conductor of the second coaxial cable, wherein the inner conductor of the first coaxial cable is connected to one end side of the inner conductor of the second coaxial cable through the switching circuit, an outer conductor of the first coaxial cable is connected to one end side of an outer conductor of the second coaxial cable through the switching circuit, the inner conductor of the first coaxial cable is connected to one end side of an inner conductor of the third coaxial cable through the switching circuit, the outer conductor of the first coaxial cable is connected to one end side of an outer conductor of the third coaxial cable through the switching circuit, and, in a case of switching the output of the amplifier to a side of the electrode, the switching circuit detaches both the inner conductor and the outer conductor of the third coaxial cable from the first coaxial cable;

switching the output of the amplifier to a side of the diagnostic circuit by the switching circuit; and diagnosing the output of the amplifier by the diagnostic circuit, and outputting a result.

Advantageous Effects of Invention

According to one aspect of the present invention, it is possible to eliminate or reduce the influence of disturbances while a diagnostic mechanism is mounted in a writing apparatus.

DESCRIPTION OF EMBODIMENTS

The embodiments below describe a configuration in which an electron beam is used as an example of a charged particle beam. However, the charged particle beam is not limited to the electron beam, and other charged particle beam such as an ion beam may also be used. Further, the charged particle beam is not limited to a single beam, and may be multiple beams. A variable-shaped type writing apparatus will be described as an example of the charged particle beam writing apparatus.

First Embodiment

Figure 1:
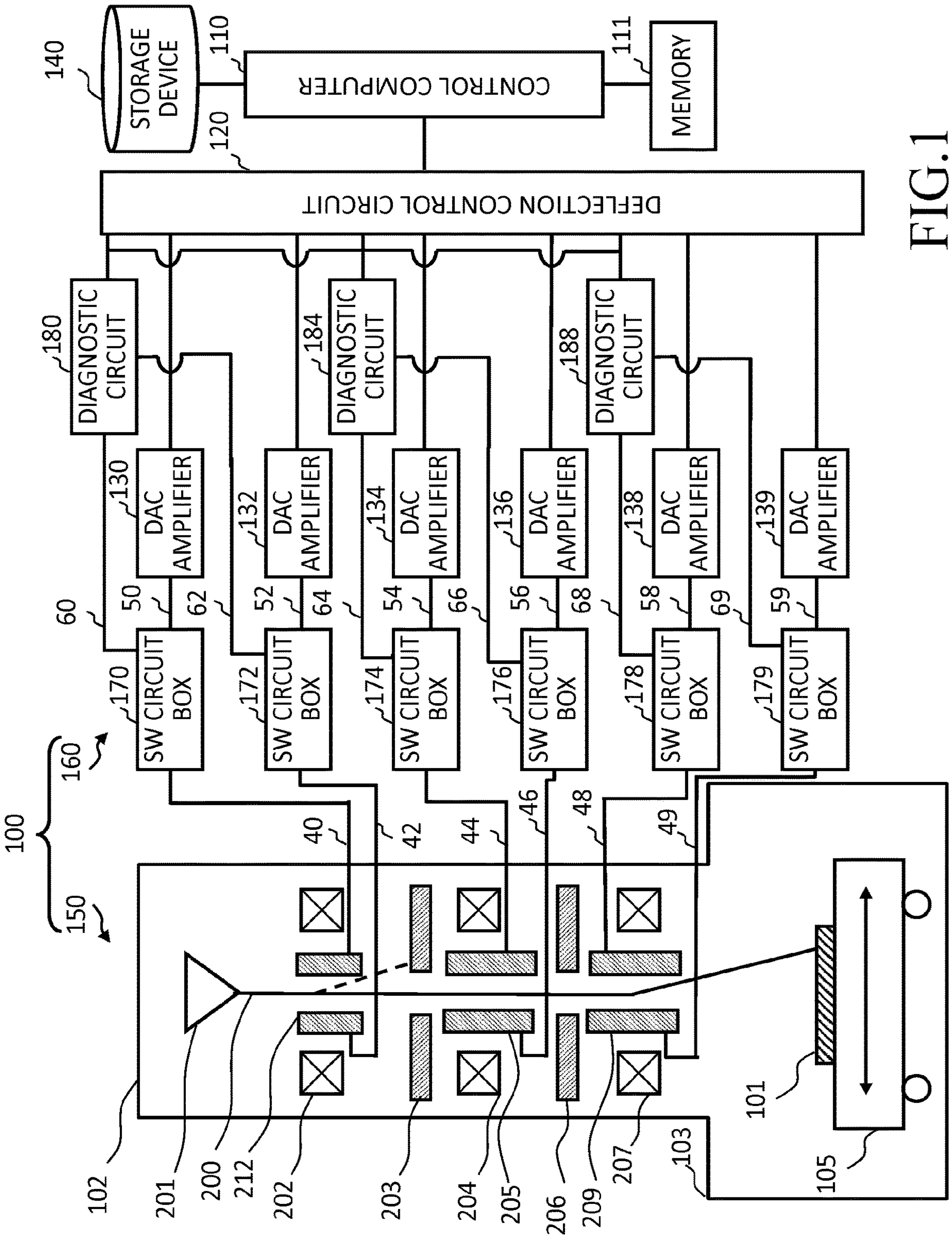
FIG. 1 is a conceptual diagram showing a configuration of a writing apparatus according to a first embodiment.

FIG. 1 is a conceptual diagram showing a configuration of a writing apparatus according to a first embodiment. As shown in FIG. 1, a writing apparatus 100 includes a writing mechanism 150 and a control system circuit 160. The writing apparatus 100 is an example of a charged particle beam writing apparatus. Particularly, it is an example of a variable-shaped type writing apparatus. The writing mechanism 150 includes an electron optical column (electron beam column) 102 and a writing chamber 103. In the electron optical column 102, there are disposed an electron gun 201, an illumination lens 202 (electromagnetic lens), a blanking deflector 212, a first shaping aperture substrate 203, a projection lens 204 (electromagnetic lens), a deflector 205, a second shaping aperture substrate 206, an objective lens 207 (electromagnetic lens), and a deflector 209. In the writing chamber 103, an XY stage 105 is disposed. On the XY stage 105, there is placed a target object 101 such as a mask to be written on which resist has been applied. The target object 101 is, for example, an exposure mask used for manufacturing semiconductor devices. Further, the target object 101 may be, for example, a mask blank on which resist has been applied and nothing has yet been written.

The control system circuit 160 includes a control computer 110, a memory 111, a deflection control circuit 120, DAC (digital-analog converter) amplifiers 130, 132, 134,

136, 138, and 139, switching circuit boxes 170, 172, 174, 176, 178, and 179, diagnostic circuits 180, 184, and 188, and a storage device 140 such as a magnetic disk drive. The control computer 110, the memory 111, the deflection control circuit 120, the switching circuit boxes 170, 172, 174, 176, 178, and 179, the diagnostic circuits 180, 184, and 188, and the storage device 140 are connected through a bus (not shown). The DAC amplifiers 130, 132, 134, 136, 138, and 139 are connected to the deflection control circuit 120. Information input/output to/from the control computer 110 and information being operated are stored in the memory 111 each time. The deflection control circuit 120, each circuit in the switching circuit boxes 170, 172, 174, 176, 178, and 179, and the diagnostic circuits 180, 184, and 188 are controlled by the control computer 110.

The blanking deflector 212 is composed of at least two electrodes, and controlled by the deflection control circuit 120 through the DAC amplifiers 130 and 132 individually disposed for each electrode. In the example of FIG. 1, the blanking deflector 212 is composed of two electrodes. The output side of the DAC amplifier 130 is connected to one electrode through the switching circuit box 170, and the output side of the DAC amplifier 132 is connected to the other electrode through the switching circuit box 172. However, it is not limited thereto. In the case of being composed of two electrodes, the output side of the DAC amplifier 130 may be connected to one electrode through the switching circuit box 170, and a ground (GND) electric potential may be connected (grounded) to the other electrode. Further, a voltage from a pulse generator instead of the DAC amplifier may be applied to one electrode of the blanking deflector 212.

The deflector 205 is composed of at least four electrodes, and controlled by the deflection control circuit 120 through the DAC amplifiers 134, 136, and so on individually disposed for each electrode. In the example of FIG. 1, two counter electrodes in the at least four electrodes are shown as the deflector 205. The case is shown where the output side of the DAC amplifier 134 is connected to one of the two electrodes through the switching circuit box 174, and the output side of the DAC amplifier 136 is connected to the other of the two electrodes through the switching circuit box 176.

The deflector 209 is composed of at least four electrodes, and controlled by the deflection control circuit 120 through the DAC amplifiers 138, 139, and so on individually disposed for each electrode. In the example of FIG. 1, two counter electrodes in the at least four electrodes are shown as the deflector 209. The case is shown where the output side of the DAC amplifier 138 is connected to one of the two electrodes through the switching circuit box 178, and the output side of the DAC amplifier 139 is connected to the other of the two electrodes through the switching circuit box 179.

A corresponding control digital signal is output from the deflection control circuit 120 to each DAC amplifier. Then, in each DAC amplifier, the digital signal is converted to an analog signal and amplified to be applied as a deflection voltage to a corresponding electrode. In other words, each DAC amplifier applies a deflection potential to an associated electrode.

Further, the output of the DAC amplifier 130 which applies a voltage to one of the two electrodes that make up the blanking deflector 212 is connected to the diagnostic circuit 180 through the switching circuit box 170. The output of the DAC amplifier 132 which applies a voltage to the other of the two electrodes that make up the blanking deflector 212 is connected to the diagnostic circuit 180 through the switching circuit box 172. The diagnostic circuit 180 diagnoses outputs of the DAC amplifiers 130 and 132.

The output of the DAC amplifier 134 which applies a voltage to one of two electrodes facing each other in the at least four electrodes that make up the deflector 205 is connected to the diagnostic circuit 184 through the switching circuit box 174. The output of the DAC amplifier 136 which applies a voltage to the other of the two electrodes facing each other in the at least four electrodes that make up the deflector 205 is connected to the diagnostic circuit 184 through the switching circuit box 176. The diagnostic circuit 184 diagnoses outputs of the DAC amplifiers 134 and 136.

Further, the output of the DAC amplifier 138 which applies a voltage to one of two counter electrodes in the at least four electrodes that make up the deflector 209 is connected to the diagnostic circuit 188 through the switching circuit box 178. The output of the DAC amplifier 139 which applies a voltage to the other of the two counter electrodes in the at least four electrodes that make up the deflector 209 is connected to the diagnostic circuit 188 through the switching circuit box 179. The diagnostic circuit 188 diagnoses outputs of the DAC amplifiers 138 and 139.

In the examples described above, one diagnostic circuit is arranged for two DAC amplifiers which supply deflection voltages to counter electrodes. However, it is not limited thereto. An individual diagnostic circuit may be arranged for each DAC amplifier.

Data (chip data: writing data) of a chip pattern being a writing target is input from the outside of the writing apparatus 100, and stored in the storage device 140. The chip data defines a figure code indicating a figure type of a figure pattern to be written, arrangement coordinates, dimensions, etc. In addition, dose information may be defined by the data. Alternatively, dose information may be input as another data.

FIG. 1 shows a configuration necessary for describing the first embodiment. Other configuration generally necessary for the writing apparatus 100 may also be included therein. For example, although the single stage deflector 209 is herein used for position deflection, a multistage deflector, such as a two-stage main/sub deflector, may also be used for position deflection. Alternatively, a multistage deflector of three or more stages may also be used for position deflection. Further, an input device, such as a mouse and a keyboard, a monitoring device, an external interface circuit, and so on may be connected to the writing apparatus 100.

Figure 2:
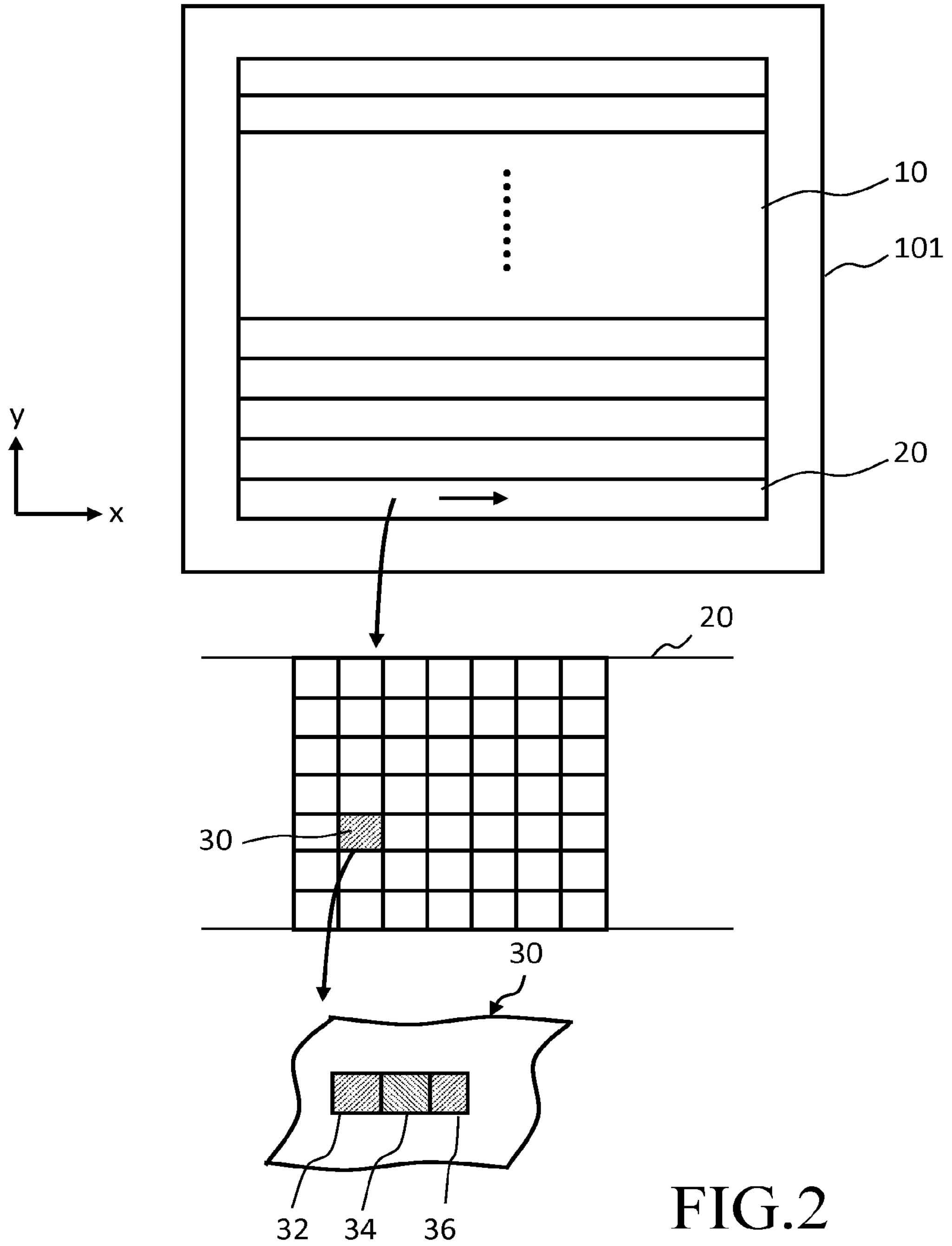
FIG. 2 is a conceptual diagram for explaining each region according to the first embodiment.

FIG. 2 is a conceptual diagram for explaining each region according to the first embodiment. In FIG. 2, a writing region 10 of the target object 101 is virtually divided, for example, in the y direction into a plurality of strip-shaped stripe regions 20 each having a width deflectable by the deflector 209. Further, each of the stripe regions 20 is virtually divided into a plurality of mesh subfields (SFs) 30 (small regions). Shot figures 32, 34, and 36 are written at respective shot positions in each SF 30.

The writing apparatus 100 performs writing processing in each stripe region 20. While the XY stage 105 is continuously moving in the −x direction, for example, writing is performed in the x direction in the first stripe region 20. In the case of writing each stripe region 20 once without performing multiple writing, it operates as follows, for example. After completing writing in the first stripe region 20, the XY stage 105 is moved in the −y direction by one stripe region 20, and also, it is moved in the x direction by one stripe region 20 to return. Then, writing is performed in the same way or in the opposite direction (−x direction) in the second stripe region 20. Then, similarly, writing is performed in the third and subsequent stripe regions 20. When performing writing in each stripe region 20, the deflector 209 deflects the electron beam 200 to each shot position of an irradiating beam in each SF 30 while deflecting the electron beam 200 to follow the movement of the XY stage 105.

When passing through the blanking deflector 212, the electron beam 200 emitted from the electron gun 201 (emission unit) is controlled by the blanking deflector 212 to irradiate the whole of the rectangular hole in the first shaping aperture substrate 203 when the beam is in a beam ON condition. Then, when in a beam OFF condition, the whole of the beam is deflected by the blanking deflector 212 to be blocked by the first shaping aperture substrate 203. The electron beam 200 that has passed through the first shaping aperture substrate 203 during the period, from the time of changing a beam OFF condition to a beam ON condition to the time of changing the beam ON condition to a beam OFF condition, serves as one shot of the electron beam. Thus, by applying potentials to the electrodes that make up the blanking deflector 212 from the DAC amplifiers, blanking deflection is performed for the electron beam 200. The blanking deflector 212 controls the direction of the passing electron beam 200 to alternately generate a beam ON condition and a beam OFF condition. For example, when in a beam ON condition, no voltage is applied to the blanking deflector 212, and, when in a beam OFF condition, a voltage is applied to the blanking deflector 21. The dose per shot of the electron beam 200 to irradiate the target object 101 is adjusted depending upon the irradiation time t of each shot.

The electron beam 200 having been controlled to be beam ON as described above irradiates the whole of the first shaping aperture substrate 203 which has a rectangular hole by the illumination lens 202. First, the electron beam 200 is shaped to be a rectangle. The electron beam 200 of the first aperture image having passed through the first shaping aperture substrate 203 is projected onto the second shaping aperture substrate 206 by the projection lens 204. The first aperture image on the second shaping aperture substrate 206 is deflection-controlled by the deflector 205 to be changed (variably shapes) to a desired beam shape and dimensions. In other words, using the first shaping aperture substrate 203 and the second shaping aperture substrate 206, the electrode that makes up the deflector 205 deflects the electron beam 200 so that the second aperture image having passed through the second shaping aperture substrate 206 may become a desired beam shape and dimensions. Such variable shaping is performed for each shot, and, for example, each shot is shaped to be a different beam shape and dimensions. Then, the electron beam 200 of the second aperture image having passed through the second shaping aperture substrate 206 is focused by the objective lens 207, and deflected by the deflector 209 to irradiate a desired position on the target object 101 placed on the XY stage 105 moving continuously. In other words, the electrode that makes up the deflector 209 deflects the electron beam 200 to a desired position on the target object 101. For example, the illumination lens 202, the first shaping aperture substrate 203, the projection lens 204, the second shaping aperture substrate 206, and the objective lens 207 are examples of the electron optical system in the first embodiment. In other words, the electron optical system irradiates the target object 101 with the electron beam 200 which is deflected by being applied with a deflection voltage by each DAC amplifier. A desired figure pattern is written by repeating such operations and combining the shot figure of each shot.

As described above, in order to perform beam deflection with high precision, it is necessary to verify whether output of each DAC amplifier is conducted highly accurately. Therefore, according to the first embodiment, a diagnostic device (circuit) for diagnosing (or verifying) each DAC amplifier is mounted in the writing apparatus 100. However, in the case of performing deflection control for the electron beam 200, to connect the diagnostic device to circuits of the writing apparatus 100 has a possibility of giving an adverse effect since the diagnostic device itself may act as a disturbance source on the DAC amplifier or output signals of the DAC amplifier. For example, the cable connected in order to diagnose outputs of the DAC amplifier may act as a disturbance antenna. Then, according to the first embodiment, although the output of each DAC amplifier is connected to the diagnostic circuit when diagnosis is performed, connection between the output of each DAC amplifier and the diagnostic circuit is blocked when writing is performed. Hereinafter, it will be specifically described.

Figure 3:
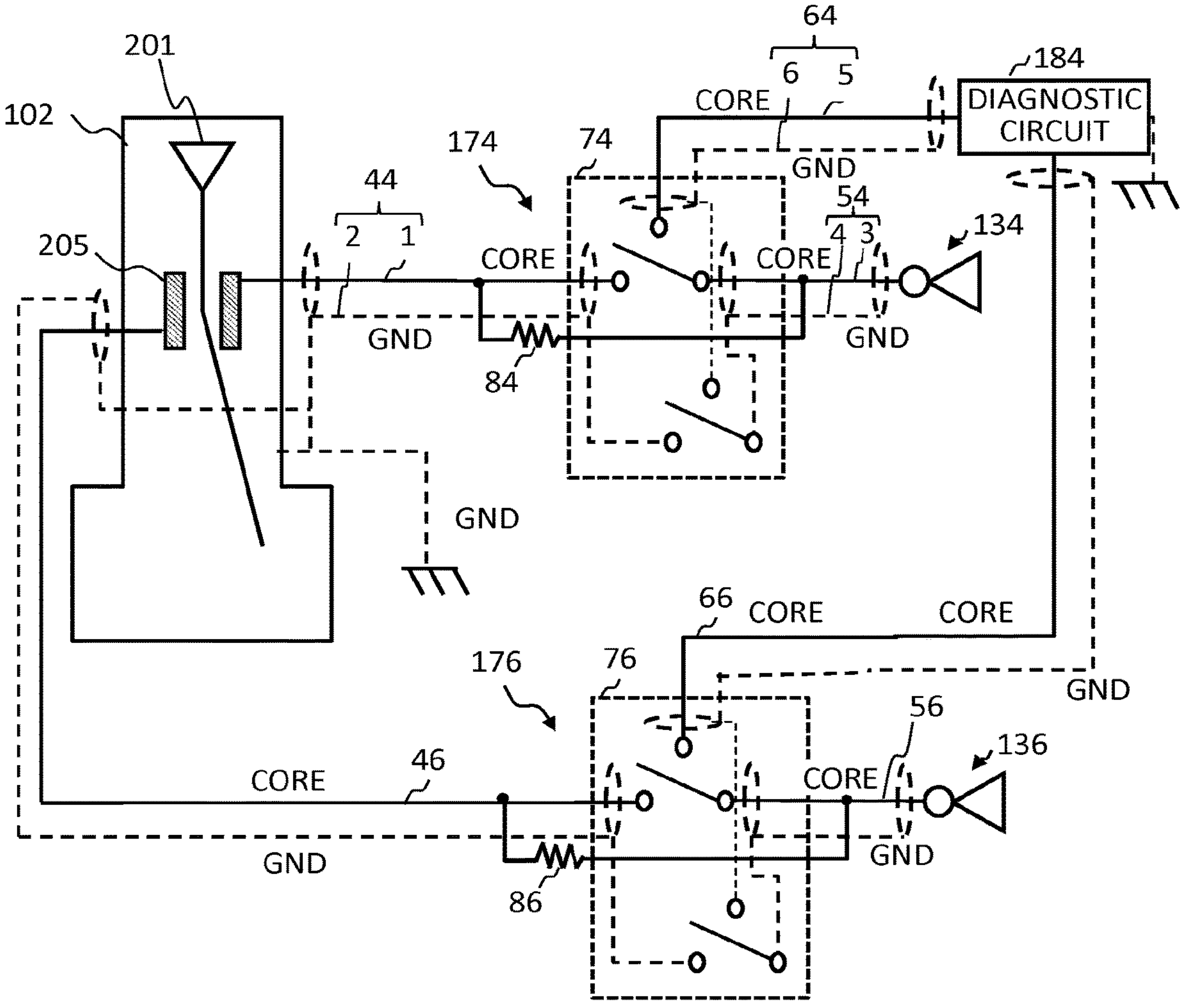
FIG. 3 is a diagram showing an example of a configuration in a switching circuit according to the first embodiment.

FIG. 3 is a diagram showing an example of a configuration in a switching circuit according to the first embodiment. In each of the switching circuit boxes 170, 172, 174, 176, 178, and 179, there are disposed a switching circuit and a resistance. The example of FIG. 3 shows the switching circuit boxes 174 and 176 connected to the two counter electrodes of the shaping deflector 205, among the switching circuit boxes 170, 172, 174, 176, 178, and 179. The same applies to the configuration in the other switching circuit boxes. The switching circuit 74 in the switching circuit box 174 is disposed between the output of the DAC amplifier 134 and one of the two counter electrodes of the shaping deflector 205, and switches the output of the DAC amplifier 134 between the one of the two counter electrodes of the deflector 205 and the diagnostic circuit 184. Similarly, the switching circuit 76 in the switching circuit box 176 is disposed between the output of the DAC amplifier 136 and the other of the two counter electrodes of the shaping deflector 205, and switches the output of the DAC amplifier 136 between the other one of the two counter electrodes of the deflector 205 and the diagnostic circuit 184. Switching the wiring by the switching circuit in each of the switching circuit boxes 170, 172, 174, 176, 178, and 179 can be operated by a relay, etc. (not shown) controlled by the control computer 110.

The inside of the switching circuit box 174 will be explained hereinafter. The output side of the DAC amplifier 134 and the switching circuit 74 are connected by a coaxial cable 54 (an example of the first coaxial cable). One of the two counter electrodes of the deflector 205 and the switching circuit 74 are connected by a coaxial cable 44 (an example of the second coaxial cable). The diagnostic circuit 184 and the switching circuit 74 are connected by a coaxial cable 64 (an example of the third coaxial cable). An inner conductor 3 of the coaxial cable 54 is connected to one end side of an inner conductor 1 of the coaxial cable 44 through the switching circuit 74. An outer conductor 4 of the coaxial cable 54 is connected to one end side of an outer conductor 2 of the coaxial cable 44 through the switching circuit 74. Similarly, the inner conductor 3 of the coaxial cable 54 is connected to one end side of an inner conductor 5 of the coaxial cable 64 through the switching circuit 74. The outer conductor 4 of the coaxial cable 54 is connected to one end side of an outer conductor 6 of the coaxial cable 64 through the switching circuit 74. In the switching circuit 74, there are disposed a terminal for switching inner conductors, and a terminal for switching outer conductors. The switching circuit 74 switches the connection with the inner conductor 3 of the coaxial cable 54 between the inner conductor 1 of the coaxial cable 44 and the inner conductor 5 of the coaxial cable 64, and, in conjunction with this, switches the connection with the outer conductor 4 of the coaxial cable 54 between the outer conductor 2 of the coaxial cable 44 and the outer conductor 6 of the coaxial cable 64. The other end of the inner conductor 1 of the coaxial cable 44 is connected to one of the two counter electrodes of the deflector 205. The outer conductor 2 of the coaxial cable 44 is grounded equipotentially to the electron optical column 102 (column). The electron optical column 102 itself is connected (grounded) to a ground (GND) potential. Therefore, when the coaxial cable 54 and the coaxial cable 44 are electrically conducted by the switching circuit 74, the outer conductor of the cable which connects the DAC amplifier 134 and one of the two counter electrodes of the deflector 205 is controlled by the ground (GND) potential at the electron optical column 102 side. The outer conductor 6 of the coaxial cable 64 is connected equipotentially to the GND potential in the diagnostic circuit 184. Therefore, when the coaxial cable 54 and the coaxial cable 64 are electrically conducted by the switching circuit 74, the outer conductor of the cable which connects the DAC amplifier 134 and the diagnostic circuit 184 is controlled by the GND potential at the diagnostic circuit 184 side.

When switching the output of the DAC amplifier 134 to one electrode side of the two counter electrodes of the deflector 205, the switching circuit 74 detaches both the inner conductor 5 and the outer conductor 6 of the coaxial cable 64 from the coaxial cable 54. Thereby, the output of the DAC amplifier 134 and the diagnostic circuit 184 can be electrically separated completely. This makes it possible to eliminate the adverse effect on the DAC amplifier and output signals of the DAC amplifier which occurs by that a disturbance caused by the diagnostic circuit 184 and the cable for the diagnostic circuit 184 enters between the DAC amplifier 134 and one of the two counter electrodes of the deflector 205.

Further, in the switching circuit box 174, there is disposed a resistance 84 which connects, parallelly to the switching circuit 74, the inner conductor 3 of the coaxial cable 54 with the inner conductor 1 of the coaxial cable 44. When switching the output of the DAC amplifier 134 to the diagnostic circuit 184 side after a deflection potential has been applied to the electrode that makes up the deflector 205, if the wiring connected to the electrode becomes an open end, an electrically floated state is generated. The deflector 205 is exposed to the electron beam 200, and charged with the electric charge of the electron beam 200. Therefore, when again switching the output of the DAC amplifier 134 to the electrode side by the switching circuit 74, an unintentional current may flow. Thus, charging of the electrode can be prevented by disposing the resistance 84 to maintain the connection between the inner conductor 3 of the coaxial cable 54 and the inner conductor 1 of the coaxial cable 44. As a resistance value of the resistance 84, it is preferable to use the range of 100 KΩ to 500 KΩ, for example.

The configuration in the switching circuit box 176 is the same as that in the switching circuit box 174. For example, the output side of the DAC amplifier 136 and the switching circuit 76 are connected by a coaxial cable 56 (another example of the first coaxial cable). The other one of the two counter electrodes of the deflector 205 and the switching circuit 76 are connected by a coaxial cable 46 (another example of the second coaxial cable). The diagnostic circuit 184 and the switching circuit 76 are connected by a coaxial cable 66 (another example of the third coaxial cable). Further, in the switching circuit box 176, there is disposed a resistance 86 which connects, parallelly to the switching circuit 76, the inner conductor of the coaxial cable 56 and the inner conductor of the coaxial cable 46.

In the first embodiment, a writing step, a switching step, and a diagnosing step are performed. In the writing step, using the writing apparatus 100 in which electrodes, DAC amplifiers, diagnostic circuits, and switching circuits are mounted as described above, the target object 101 is irradiated with the electron beam 200 deflected by being applied with a deflection potential by the DAC amplifier. In the switching step, the output of the DAC amplifier 134 is switched to the diagnostic circuit 184 side by using the switching circuit 74, for example. In the diagnosing step, the output of the DAC amplifier 134 is diagnosed by the diagnostic circuit 184, for example, and the result is output.

Diagnosis of the output of the DAC amplifier 134 is preferably performed before starting writing. Thereby, writing can be executed in a state where a certain guarantee has been given to operations of the DAC amplifier. Alternatively, it is preferable to perform the diagnosis during a period of no irradiation with the electron beam 200 being conducted between the stripe regions 20.

Figure 4:
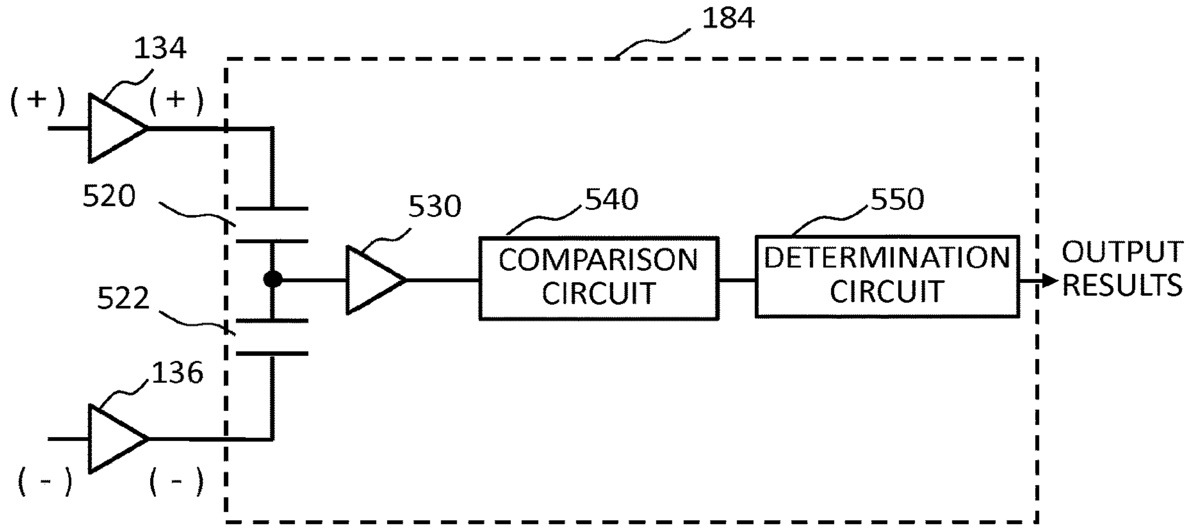
FIG. 4 is a diagram showing an example of a configuration of a diagnostic circuit according to the first embodiment.

FIG. 4 is a diagram showing an example of a configuration of a diagnostic circuit according to the first embodiment. For beam deflection, the deflectors 205 and 209 adopt a method of applying opposite phase voltages of positive-negative reversed to paired electrodes. The example of FIG. 4 shows the case of diagnosing the DAC amplifiers 134 and 136 which apply potentials to paired electrodes of the deflector 205. In that case, the DAC amplifier 134 (one) applies, while being synchronized with the DAC amplifier 136 (the other), a potential to an output target electrode. If a failure occurs in at least one of the DAC amplifiers 134 and 136, opposite phase voltages of positive-negative reversed are not generated. Accordingly, since the amount of beam deflection becomes different from a desired amount, an abnormality occurs in writing.

In FIG. 4, when there is an abnormality in at least one of the two DAC amplifiers 134 and 136, the diagnostic circuit 184 detects the abnormality. The diagnostic circuit 184 includes capacitors 520 and 522, an amplifier 530 for measurement, a comparison circuit 540, and a determination circuit 550. Outputs of the DAC amplifiers 134 and 136 are switched to the diagnostic circuit 184 side by the switching circuit 74. The output of the DAC amplifier 134 is connected to one end of the capacitor 520 (first capacitor). The output of the DAC amplifier 136 is connected to one end of the capacitor 522 (second capacitor). The other ends of the two capacitors 520 and 522 are connected to each other, and, at the midpoint, connected to the input terminal of the measurement amplifier 530. The output terminal of the measurement amplifier 530 is connected to the input terminal of the comparison circuit 540, and the input terminal of the determination circuit 550 is connected to the output terminal of the comparison circuit 540.

A direction to output a certain positive voltage is input to the DAC amplifier 134. Then, the DAC amplifier 134 outputs a positive analog signal. A direction to output a certain negative voltage is input to the DAC amplifier 136. Then, the DAC amplifier 136 outputs a negative analog signal. When the output of the DAC amplifier 134 is input to the capacitor 520, a response signal from the capacitor 520 is detected at the measurement amplifier 530 side. Similarly, when the output of the DAC amplifier 136 is input to the capacitor 522, a response signal from the capacitor 522 is detected at the measurement amplifier 530 side. The measurement amplifier 530 inputs the response signals of the capacitors 520 and 522, amplifies and outputs an additional value of the response signals of the capacitors 520 and 522 to the comparison circuit 540.

Figure 5:
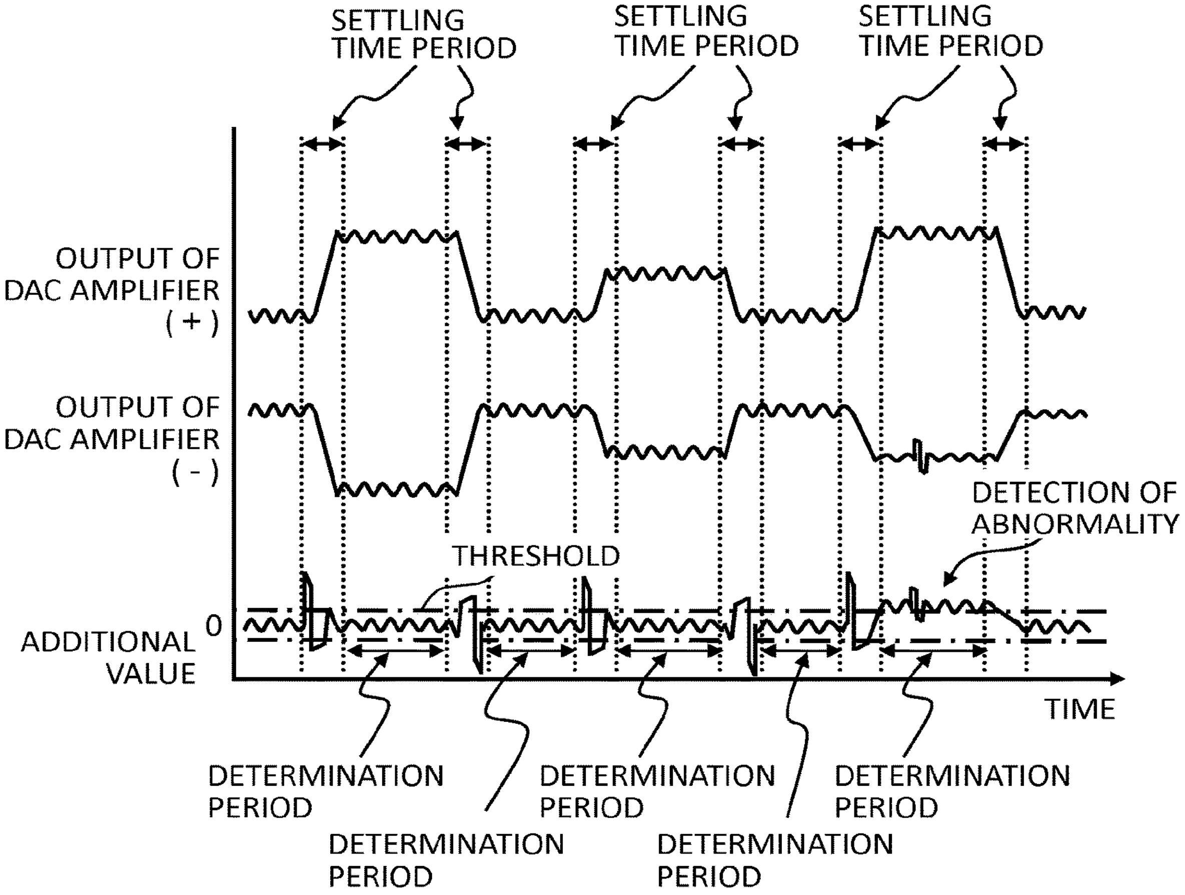
FIG. 5 is a diagram showing an example of outputs of two DAC amplifiers and an additional value of the outputs of the two DAC amplifiers according to the first embodiment.
Figure 6:
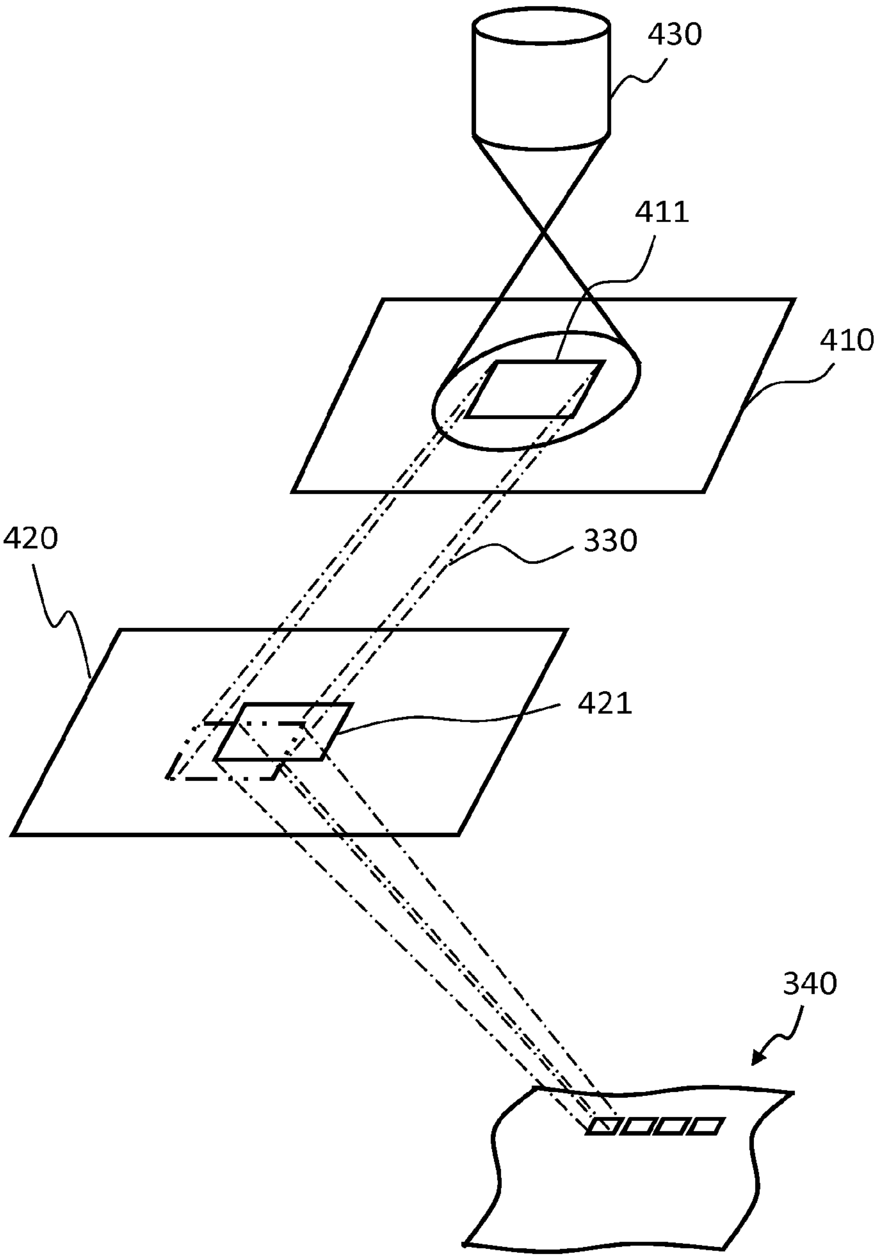
FIG. 6 is a conceptual diagram for explaining operations of a variable-shaped type electron beam writing apparatus.

FIG. 5 is a diagram showing an example of outputs of two DAC amplifiers and an additional value of the outputs of the two DAC amplifiers according to the first embodiment. Here, if both the two DAC amplifiers 134 and 136 are not out of order, since the additional value of amplified response signals of the capacitors 520 and 522 is an additional value of opposite phase signals whose positive and negative are just reversed, they ideally become analog values of exact opposite waveforms. Therefore, by adding the two output values, the additional value ideally becomes 0. On the other hand, if there is an abnormality in at least one of the DAC amplifiers 134 and 136, the additional value does not become 0. Then, the comparison circuit 540 compares the additional value amplified by the measurement amplifier 530 with a predetermined threshold (reference voltage). When, for example, as a result of the comparison, the additional value exceeds the predetermined threshold, an H level signal is output to the determination circuit 550, and when it does not exceed the predetermined threshold, an L level signal is output to the determination circuit 550. Then, the determination circuit 550 processes the output value from the comparison circuit 540 in order to determine whether it is normal or abnormal. Specifically, if the output value from the comparison circuit 540 becomes an H level signal during a determination period excluding a settling time period, the determination circuit 550 determines that at least one of the DAC amplifiers 134 and 136 is abnormal, and outputs this result indicating normal or abnormal. More preferably, information on the result is output as, for example, a digital signal because it later becomes easy to use the result information. By such a configuration, it becomes possible to immediately detect, at an abnormal time, that at least one of the DAC amplifiers 134 and 136 is abnormal. Further, a noise has usually been added to an analog value as shown in FIG. 5, and therefore, an incorrect determination can be reduced by using a predetermined threshold when performing determination. For example, instead of immediately determining that there is an abnormality when it becomes an H level signal for a moment, it is also preferable for the determination circuit 550 to output a signal of an abnormality when it becomes an H level signal during a period based on a time length or time rate higher than a predetermined threshold in a determination period. When a noise is small or ignorable, the threshold may be 0 or substantially 0. Further, the difference from a reference threshold (reference voltage) can be clarified by amplifying by the measurement amplifier 530, and thus, the accuracy of comparison in the comparison circuit 540 can be increased. Particularly, even when the degree of abnormality of an amplifier is small, it can be detected by being amplified. The determination result in the determination circuit 550 is output to the control computer 110. Then, it is displayed on a monitor or alarm lamp (not shown), etc., so that the user can confirm the abnormality.

The method of diagnosing is not limited to the one described above, and other methods can also be used. For example, the output of each DAC amplifier may be individually monitored by an oscilloscope etc.

Figure 7:
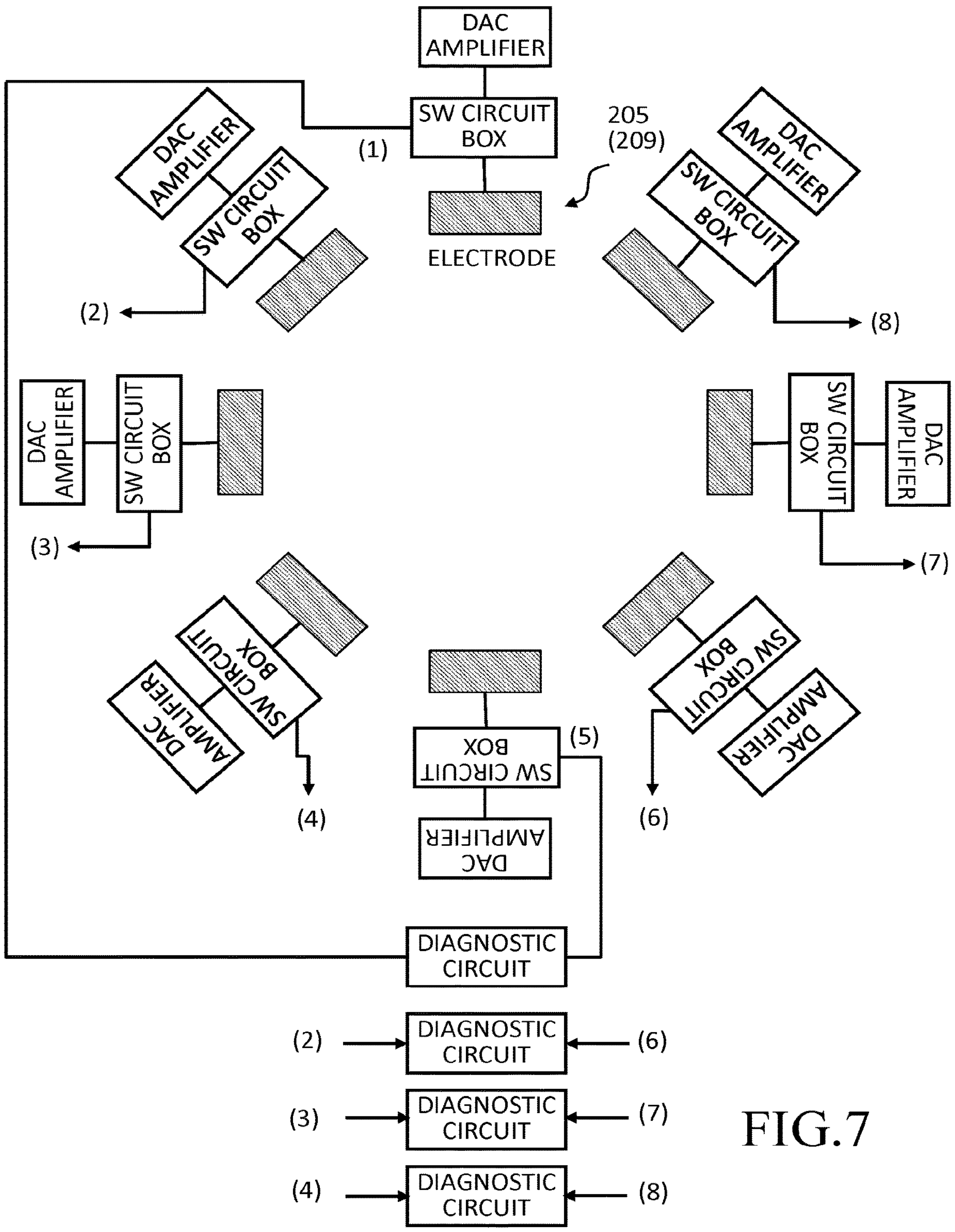
FIG. 7 is a diagram showing an example of a configuration of an arrangement of a shaping deflector, a switching circuit box, and a DAC amplifier according to the first embodiment.

FIG. 7 is a diagram showing an example of a configuration of an arrangement of a shaping deflector, a switching circuit box, and a DAC amplifier according to the first embodiment. In FIG. 7, the deflector 205 is composed of at least four electrodes. FIG. 7 shows the case where it is composed of eight electrodes. For each electrode, a group of the electrode concerned, an electrode switching circuit box, and a DAC amplifier is formed. To each electrode, the output side of the DAC amplifier is connected through the electrode switching circuit box. One diagnostic circuit is arranged for each pair of counter electrodes relating to the eight DAC amplifiers that make up the deflector 205. The same electric potentials with positive-negative reversed signs are applied to two counter electrodes. In the example of FIG. 7, an electrode switching circuit box for the electrode (1) and an electrode switching circuit box for the electrode (5) being opposite to the electrode (1) are connected to the first diagnostic circuit. An electrode switching circuit box for the electrode (2) and an electrode switching circuit box for the electrode (6) being opposite to the electrode (2) are connected to the second diagnostic circuit. An electrode switching circuit box for the electrode (3) and an electrode switching circuit box for the electrode (7) being opposite to the electrode (3) are connected to the third diagnostic circuit. An electrode switching circuit box for the electrode (4) and an electrode switching circuit box for the electrode (8) being opposite to the electrode (4) are connected to the fourth diagnostic circuit. The configuration in each switching circuit box is the same as that explained in FIG. 3. The configuration in each diagnostic circuit is the same as that explained in FIG. 4.

Similarly, the deflector 209 is composed of at least four electrodes. FIG. 7 shows the case where it is composed of eight electrodes. For each electrode, a group of the electrode concerned, an electrode switching circuit box, and a DAC amplifier is formed. To each electrode, the output side of the DAC amplifier is connected through the electrode switching circuit box. One diagnostic circuit is arranged for each pair of counter electrodes relating to the eight DAC amplifiers that make up the deflector 209. The same electric potentials with positive-negative reversed signs are applied to two counter electrodes. In the example of FIG. 7, an electrode switching circuit box for the electrode (1) and an electrode switching circuit box for the electrode (5) being opposite to the electrode (1) are connected to the first diagnostic circuit. An electrode switching circuit box for the electrode (2) and an electrode switching circuit box for the electrode (6) being opposite to the electrode (2) are connected to the second diagnostic circuit. An electrode switching circuit box for the electrode (3) and an electrode switching circuit box for the electrode (7) being opposite to the electrode (3) are connected to the third diagnostic circuit. An electrode switching circuit box for the electrode (4) and an electrode switching circuit box for the electrode (8) being opposite to the electrode (4) are connected to the fourth diagnostic circuit. The configuration in each switching circuit box is the same as that explained in FIG. 3. The configuration in each diagnostic circuit is the same as that explained in FIG. 4.

As described above, according to the first embodiment, the influence of disturbances can be eliminated or reduced while the diagnostic circuits 180, 184, and 188 are mounted in the writing apparatus 100.

Embodiments have been explained referring to specific examples described above. However, the present invention is not limited to these specific examples.

While the apparatus configuration, control method, and others not directly necessary for explaining the present invention are not described, they can be appropriately selected and used when needed.

Further, any charged particle beam writing apparatus and charged particle beam writing method that include elements of the present invention and that can be appropriately modified by those skilled in the art are included within the scope of the present invention.

INDUSTRIAL APPLICABILITY

The present invention relates to a charged particle beam writing apparatus and a charged particle beam writing method. For example, it can be applied to a writing apparatus employing an amplifier that deflects electron beams with which a target object is written.

REFERENCE SIGNS LIST

1 Inner Conductor
2 Outer Conductor
3 Inner Conductor
4 Outer Conductor
5 Inner Conductor
6 Outer Conductor
10 Writing Region
20 Stripe Region
30 SF
32, 34, 36 Shot FIG.
44 Coaxial Cable
46 Coaxial Cable
54 Coaxial Cable
56 Coaxial Cable
64 Coaxial Cable
66 Coaxial Cable
74 Switching Circuit
76 Switching Circuit
84 Resistance
86 Resistance
100 Writing Apparatus
101 Target Object
102 Electron Optical Column
103 Writing Chamber
105 XY Stage
110 Control Computer
111 Memory
120 Deflection Control Circuit
130, 132, 134, 136, 138, 139 DAC Amplifier
170, 172, 174, 176, 178, 179 Switching Circuit Box
180, 184, 188 Diagnostic Circuit
140 Storage Device
150 Writing Mechanism
160 Control System Circuit
201 Electron Gun
202 Illumination Lens
203 First Shaping Aperture Substrate
204 Projection Lens
205 Deflector
206 Second Shaping Aperture Substrate
207 Objective Lens
209 Deflector
212 Blanking Deflector
330 Electron Beam
340 Target Object
410 First Shaping Aperture Substrate
411 Aperture
420 Second Shaping Aperture Substrate
421 Variable Shaped Aperture 421
430 Charged Particle Source
520, 522 Capacitor
530 Measurement Amplifier
540 Comparison Circuit
550 Determination Circuit

The invention claimed is:

1. A charged particle beam writing apparatus comprising:

an electrode configured to deflect a charged particle beam;

an amplifier configured to output a deflection potential;

a diagnostic circuit configured to diagnose the amplifier;

a switching circuit arranged between an output of the amplifier and the electrode and having a switch, the switching circuit configured to switch the deflection potential output by the amplifier between the electrode and the diagnostic circuit, and configured to apply the deflection potential of the amplifier to the diagnostic circuit in a case that the switch is connected to the diagnostic circuit and the switch is detached from the electrode, wherein the diagnostic circuit diagnoses the amplifier using the deflection potential applied through the switch;

an electron optical system configured to irradiate a target object with the charged particle beam deflected by being applied with the deflection potential by the amplifier;

a column configured to include therein the electrode and the electron optical system;

a first coaxial cable configured to connect an output side of the amplifier with the switching circuit;

a second coaxial cable configured to connect the electrode with the switching circuit;

a third coaxial cable configured to connect the output side of the amplifier with the diagnostic circuit; and a resistance configured to connect, parallelly to the switching circuit, an inner conductor of the first coaxial cable with an inner conductor of the second coaxial cable, wherein the inner conductor of the first coaxial cable is connected to one end side of the inner conductor of the second coaxial cable through the switching circuit, and an outer conductor of the first coaxial cable is connected to one end side of an outer conductor of the second coaxial cable through the switching circuit, the inner conductor of the first coaxial cable is connected to one end side of an inner conductor of the third coaxial cable through the switching circuit, and the outer conductor of the first coaxial cable is connected to one end side of an outer conductor of the third coaxial cable through the switching circuit, and in a case of switching the output of the amplifier to a side of the electrode, the switching circuit detaches both the inner conductor and the outer conductor of the third coaxial cable from the first coaxial cable.

2. The charged particle beam writing apparatus according to claim 1 further comprising:

a first shaping aperture substrate and a second shaping aperture substrate, wherein the electrode deflects the charged particle beam in order that the charged particle beam is shaped by the first shaping aperture substrate and the second shaping aperture substrate.

3. The charged particle beam writing apparatus according to claim 1, wherein the electrode deflects the charged particle beam to a desired position on the target object.

4. The charged particle beam writing apparatus according to claim 1, wherein the switching circuit switches a connection with the inner conductor of the first coaxial cable between the inner conductor of the second coaxial cable and the inner conductor of the third coaxial cable, and, in conjunction with this, switches a connection with the outer conductor of the first coaxial cable between the outer conductor of the second coaxial cable and the outer conductor of the third coaxial cable.

5. The charged particle beam writing apparatus according to claim 1, wherein the electrode is used as a first electrode, further comprising:

a second electrode configured to make up a deflector by being paired with the first electrode;

a second amplifier configured to apply a deflection potential to the second electrode; and a second switching circuit arranged between an output of the second amplifier and the second electrode, and configured to switch the output of the second amplifier between the second electrode and the diagnostic circuit.

6. The charged particle beam writing apparatus according to claim 5, wherein the diagnostic circuit is used as a first diagnostic circuit, further comprising:

a third electrode and a fourth electrode configured to make up the deflector in combination with the first electrode and the second electrode;

a third amplifier and a fourth amplifier configured to apply deflection potentials to the third electrode and the fourth electrode;

a second diagnostic circuit configured to diagnose the third amplifier and the fourth amplifier;

a third switching circuit arranged between an output of the third amplifier and the third electrode, and configured to switch the output of the third amplifier between the third electrode and the second diagnostic circuit; and a fourth switching circuit arranged between an output of the fourth amplifier and the fourth electrode, and configured to switch the output of the fourth amplifier between the fourth electrode and the second diagnostic circuit.

7. A charged particle beam writing method comprising:

irradiating a target object with a charged particle beam which is deflected by being applied with a deflection potential output by an amplifier, using a charged particle beam writing apparatus that includes an electrode configured to deflect the charged particle beam, a diagnostic circuit configured to diagnose the amplifier, a switching circuit arranged between an output of the amplifier and the electrode and having a switch, the switching circuit being configured to switch the deflection potential output by the amplifier between the electrode and the diagnostic circuit and configured to apply the deflection potential of the amplifier to the diagnostic circuit in a case that the switch is connected to the diagnostic circuit and the switch is detached from the electrode, wherein the diagnostic circuit diagnoses the amplifier using the deflection potential applied through the switch, an electron optical system configured to irradiate the target object with the charged particle beam deflected by being applied with the deflection potential by the amplifier, a column configured to include therein the electrode and the electron optical system, a first coaxial cable configured to connect an output side of the amplifier with the switching circuit, a second coaxial cable configured to connect the electrode with the switching circuit, a third coaxial cable configured to connect the output side of the amplifier with the diagnostic circuit, and a resistance configured to connect, parallelly to the switching circuit, an inner conductor of the first coaxial cable with an inner conductor of the second coaxial cable, wherein the inner conductor of the first coaxial cable is connected to one end side of the inner conductor of the second coaxial cable through the switching circuit, an outer conductor of the first coaxial cable is connected to one end side of an outer conductor of the second coaxial cable through the switching circuit, the inner conductor of the first coaxial cable is connected to one end side of an inner conductor of the third coaxial cable through the switching circuit, the outer conductor of the first coaxial cable is connected to one end side of an outer conductor of the third coaxial cable through the switching circuit, and, in a case of switching the output of the amplifier to a side of the electrode, the switching circuit detaches both the inner conductor and the outer conductor of the third coaxial cable from the first coaxial cable;

switching the output of the amplifier to a side of the diagnostic circuit by the switching circuit; and diagnosing the output of the amplifier by the diagnostic circuit, and outputting a result.

8. The charged particle beam writing method according to claim 7 further comprising:

deflecting, by applying the deflection potential by the amplifier, the charged particle beam in order that the charged particle beam is shaped.

9. The charged particle beam writing method according to claim 7 further comprising:

deflecting, by applying the deflection potential by the amplifier, the charged particle beam to a desired position on the target object.

10. The charged particle beam writing method according to claim 7 further comprising:

performing blanking-deflection of the charged particle beam by applying the deflection potential by the amplifier.

* * * * *